United States Patent [19]
Philippe

[11] Patent Number: 5,621,356
[45] Date of Patent: Apr. 15, 1997

[54] AMPLIFIER HAVING A REDUCED DISTORTION RATE

[75] Inventor: Pascal Philippe, Caen, France

[73] Assignee: U.S. Philips Corporation, New York, N.Y.

[21] Appl. No.: 567,252

[22] Filed: Dec. 5, 1995

[30] Foreign Application Priority Data

Dec. 7, 1994 [FR] France .................................. 94 14730

[51] Int. Cl.$^6$ ..................................................... H03F 3/45
[52] U.S. Cl. ........................................ 330/252; 330/255
[58] Field of Search ................................. 330/252, 255, 330/260, 261, 262, 271, 301

[56] References Cited

U.S. PATENT DOCUMENTS 4,511,852  4/1985  Henrich et al. ......................... 330/252
5,142,245  8/1992  Barbu ....................................... 330/255

FOREIGN PATENT DOCUMENTS 58-195305  11/1983  Japan ................................. H03F 1/02

*Primary Examiner*—Steven Mottola
*Attorney, Agent, or Firm*—Edward W. Goodman

[57] ABSTRACT

An amplifier including a first output transistor (T2a) and a second output transistor (T3a) having the same polarity and arranged in push-pull configuration, and an input transistor (T1a) whose collector is coupled to the base of the first output transistor (T2a). The amplifier also includes a third output transistor (T2b) and a fourth output transistor (T3b) which are also arranged in push-pull configuration, and a supplementary input transistor (T11b) whose emitter is coupled to the emitter of the input transistor (T1a) and whose collector is coupled to the base of the second output transistor (T3a) and to the base of the third output transistor (T2b), the base of the fourth output transistor (T3b) being coupled to the collector of the input transistor (T1a).

8 Claims, 1 Drawing Sheet

5,621,356

1

AMPLIFIER HAVING A REDUCED DISTORTION RATE

BACKGROUND OF THE INVENTION

1. Field of the Invention

The invention relates to an amplifier comprising a first output transistor and a second output transistor having the same polarity and arranged in push-pull configuration, and an input transistor whose collector is coupled to the base of the first output transistor.

2. Description of the Related Art

Such an amplifier is particularly known from the document JP-A-58-195306. It may be realized in an integrated form by using only transistors of the NPN type so that this amplifier is capable of working at a relatively high frequency.

As an intermediate frequency amplifier for television signals, the known amplifier is not completely satisfactory for different reasons:

Due to its asymmetrical structure, this amplifier does not allow elimination of parasitic signals which may be superimposed on the input signal and are amplified along with the useful signal. This drawback can be remedied by a differential structure instead of an asymmetrical one. For this purpose, one may consider to complete the known amplifier by means of a second part which is symmetrical with the first part and by using the two inputs and the two outputs of this structure in a differential mode. However, this solution does not have a sufficient rate of common mode rejection.

It would also be desirable to have an amplifier whose linearity is improved.

SUMMARY OF THE INVENTION

It is thus an object of the invention to provide an amplifier whose performance is affected to a smaller extent by the limitations mentioned hereinbefore.

According to the invention, an amplifier of the type described in the opening paragraph is characterized in that it also comprises a third and a fourth output transistor which are also arranged in push-pull configuration, as well as a supplementary input transistor whose emitter is coupled to the emitter of said input transistor and whose collector is coupled to the base of the second output transistor and to the base of the third output transistor, the base of the fourth output transistor being coupled to the collector of said input transistor.

Because of its structure which is easily rendered symmetrical, the amplifier according to the invention may function in accordance with a mode which is really differential because the base of the second output transistor is no longer connected to the emitter of the input transistor.

An advantageous embodiment of the invention thus ensures that said input transistor and the supplementary input transistor are mutually arranged as a differential pair and that in particular, the emitter of said input transistor and the emitter of the supplementary input transistor are each fed by a current source and are mutually coupled by a resistor referred to as first emitter resistor.

The symmetrical structure of the amplifier permits a choice of conditions of DC bias of the transistors in the circuit in a manner which is independent of the specific arrangements corresponding to the distortion reduction of the amplified signal.

2

In accordance with a preferred embodiment of the invention, the coupling between the collector of said input transistor and the base of the fourth output transistor is ensured by a transistor which is supplementary to the first output transistor and whose base is connected to the base of the first output transistor, supplying, via its emitter, a voltage signal, a fraction of which is applied to the base of the fourth output transistor, and, symmetrically, the coupling between the collector of the supplementary input transistor and the base of the second output transistor is ensured by a transistor which is supplementary to the third output transistor whose base is connected to the base of the third output transistor supplying, via its emitter, a voltage signal, a fraction of which is applied to the base of the second output transistor.

Advantageously, the fraction of the voltages applied to the bases of the second and the fourth output transistor is derived from a divider bridge which includes a series-arranged diode in one of its branches. This diode is favorable for the stability of operation of the amplifier as a function of temperature variations.

A supplementary control parameter for the operation of the second and the fourth output transistor allowing a control of the current and the linearity of the signal supplied by these transistors is obtained by the fact that the emitter of the second output transistor and the emitter of the fourth output transistor are mutually coupled by means of a resistor referred to as second emitter resistor.

As the voltage signal present at the emitter of the transistor which is supplementary to the first output transistor, is a signal already amplified by the input transistor, a divider bridge permits an arbitrary choice of the amplitude of the signal to be applied to the base of the fourth output transistor and, reciprocally, as regards the transistor which is supplementary to the third output transistor and the supplementary input transistor for obtaining an optimum operation of the amplifier and particularly a good linearity of the output signal.

The linearity is further improved by an arrangement in which a negative feedback resistor is directly connected between the common point of the first and second output transistors and the base of said input transistor, and a further negative feedback resistor is directly connected between the common point of the third and fourth output transistors and the base of the supplementary output transistor.

This direct feedback is rendered possible by the fact that the quiescent point of the amplifier according to the invention may be controlled in a precise manner and without having to meet a compromise, as is the case in the prior-art amplifier. A negative feedback rate may be controlled by the value of the negative feedback resistor for obtaining a given distortion rate which is independent of the frequency of the signal.

In accordance with this embodiment, it is advantageous if a base resistor is connected between a common mode voltage and the base of said input transistor on the one hand, and the base of the supplementary input transistor, on the other hand.

A signal having a larger amplitude may thus be supplied from the output of the amplifier.

These and other aspects of the invention will be apparent from and elucidated with reference to the embodiments described hereinafter.

DESCRIPTION OF THE PREFERRED EMBODIMENT

Figure 1:
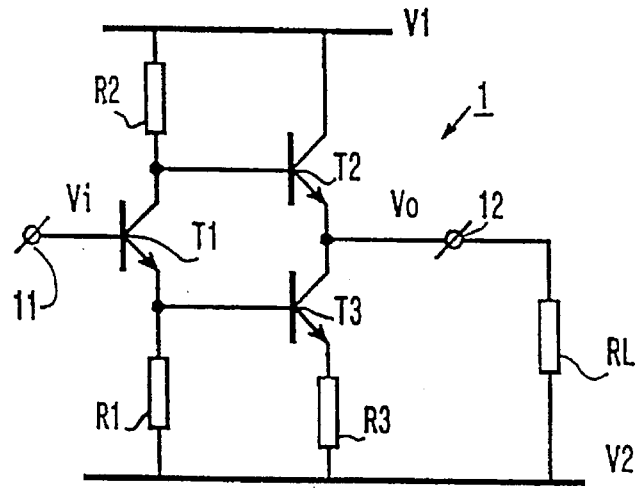
FIG. 1 shows a diagram of a prior-art amplifier.

FIG. 1 shows the diagram of a known amplifier which comprises a module 1 fed between a first power supply source V1 and a second power supply source V2 serving as a voltage reference, this module comprising a first NPN transistor T1 arranged in a common emitter configuration and receiving an AC input signal V1 at its base from an input terminal 11. The emitter of the transistor T1 is connected to the reference power supply source V2 via an emitter resistor R1. The collector of the transistor T1 is connected to the positive power supply source V1 via a collector resistor R2. The module 1 also comprises a second NPN transistor T2 which operates as an emitter follower of the voltage at the collector of the transistor T1, this voltage being applied to its base. The second transistor T2 supplies an output signal Vo at an output terminal 12 connected to its emitter, this output terminal being intended to be connected to a charge resistor RL connected to the reference voltage V2. The module 1 further comprises a third transistor T3, which is also of the NPN type and has its base connected to the emitter of the first transistor T1 and is arranged in a common emitter configuration, while its collector is connected to the emitter of the second transistor 72 and its emitter is connected to the reference voltage V2 via an emitter resistor R3. Consequently, the base of the transistor T3 receives a signal which is in phase with the input signal V1 and its collector supplies an alternating current to its charge resistor RL which current is in phase opposition with the voltage supplied by the emitter of the second transistor T2.

The second and third transistors T2, T3 thus function in the push-pull mode. By taking the power of the signal at the charge and the distortion of this signal as criteria of optimization, it appears that the best operating conditions are those for which the amplitude of the AC current supplied by T3 is substantially equal to that of the current supplied by T2.

A very simple computation of the corresponding conditions then leads to the relation between the resistance values: R2/R1=2.RL/R3 in which relation, the resistance values are represented by the reference sign of these resistances.

The ratio R2/R1 fixes the voltage gain value of this amplifier but here, the value of R1 should be sufficiently high for a DC voltage applied to the base of the transistor T3 to turn on this transistor. When the power supply voltage (V1–V2) is not higher than 5 volts, it is thus necessary to use a small ratio R2/R1 (near unity) at which the linearity of the amplifier is satisfactory but its voltage gain remains insufficient.

In contrast, it would be desirable to have an amplifier which is not subject to such limitations with a higher voltage gain of the order of, for example, 10 and for which a negative feedback could be applied independently of the frequency of the signal through a direct connection between the output and the input by means of a negative feedback resistor. Moreover, by utilizing a symmetrical operation mode, it would be advantageous to improve the insufficient common mode rejection rate obtained by the known amplifier.

Figure 2:
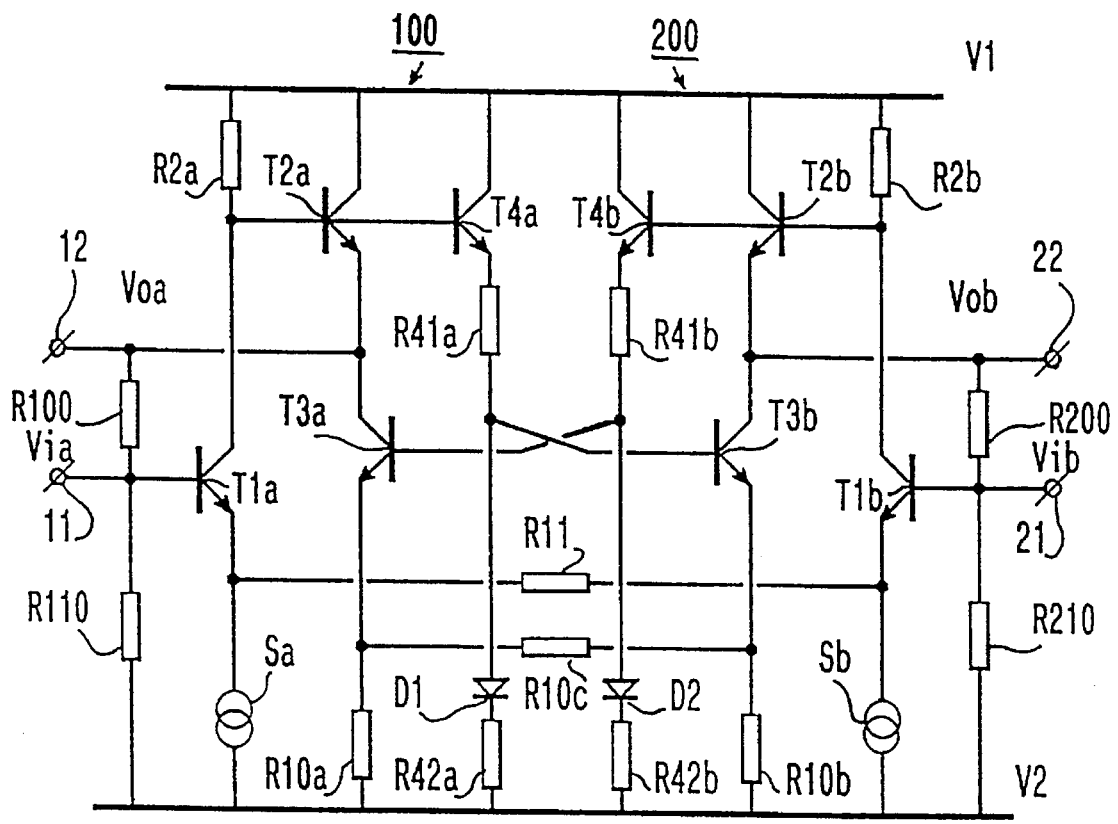
FIG. 2 shows the electrical circuit diagram of an embodiment of an amplifier according to the invention.

FIG. 2 is the electrical circuit diagram of an amplifier according to the invention. The amplifier shown in FIG. 2 is of a symmetrical type by the addition of a second module 200 to a first module 100, the second module being similar to the first module. The first module 100 has an input terminal 11 for an input signal Via and an output terminal 12 for an output signal Voa, while the second module 200 has an input terminal 21 for an input signal Vib and an output terminal 22 for an output signal Vob. The input signals Via and Vib are not necessarily complementary AC signals, while the output signals Voa and Vob are rendered complementary. They correspond to the difference (Via–Vib) between the input signals multiplied by the gain of the amplifier.

The input terminal 11 of the module 100 is connected to the base of a first input transistor T1a which is arranged in a common emitter configuration and whose collector is connected to the positive power supply source V1 via a collector resistor R2a. Symmetrically, the signal input 21 of the module 200 is connected to the base of a second input transistor T1b which is symmetrical to transistor T1a and whose collector is coupled to the power supply source V1 via a collector resistor R2b. The transistors T1a and T1b are arranged as a differential pair because their emitters are joined via an emitter resistor R11. Each of these emitters is also coupled to the reference power supply source V2 via a current source Sa in the first module 100 and a current source Sb in the second module 200. The module 100 also comprises a first output transistor T2a whose base is connected to the collector of the transistor T1a and which is arranged as an emitter follower, its emitter being connected to the output terminal 12. A second output transistor T3a has its collector connected to the emitter of the transistor T2a and its emitter coupled to the second power supply source V2 via an emitter resistor R10a.

A symmetrical arrangement is realized in the second module 200 with the transistors T2b whose base is connected to the collector of the transistor T1b, whose emitter is connected to the output terminal 22 and to the collector of a transistor T3b which has its emitter connected to the power supply source V2 via an emitter resistor R10b. In order that the pairs of transistors T2a, T3a and T2b, T3b operate in the push-pull mode, as is the case with the known amplifier of FIG. 1, it is necessary that the bases of the transistors T3a and T3b receive a signal which is in phase with the corresponding input signal of the same module.

To this end, the module 100 also comprises a supplementary transistor T4a whose base is coupled to the base of the transistor T2a as well as to the collector of the transistor T1a and, symmetrically, the module 200 also comprises a supplementary transistor T4b whose base is coupled to the base of the transistor T2b and to the collector of the transistor T1b. The transistors T4a and T4b operate as emitter followers and have their collectors fed by the power supply source V1, while the emitter of each of these transistors is connected to a divider bridge constituted by a resistor R41a, a diode D1 and a resistor R42a in that order as far as the divider bridge of module 100 is concerned, and a divider bridge successively comprising a resistor R41b, a diode D2 and a resistor R42b as far as the module 200 is concerned. If in the Figure the diodes are represented by D1 and D2 it is clear that these may advantageously be realized in the form of NPN transistors connected as diodes in the forward direction. The intermediate point of the divider bridge of the module 200, between the resistor R41b and the diode D2, is connected to the base of the transistor T3a of the module 100. Reciprocally, the intermediate point of the divider bridge of the module 100 between the resistor R41a and the diode D1 is connected to the base of the transistor T3b of the module 200. In each module, the divider bridge is submitted to a voltage which is in phase opposition with the input voltage of the same module. In contrast, with the base of the second output transistor of one of the modules being connected to the intermediate point of the divider bridge of the other module, the condition that the signal applied to this base should be in phase with the input signal in the same module is realized.

The intermediate point of the two divider bridges determines, as a function of the division ratio, the DC bias voltage applied to the bases of the transistors T3a and T3b, as well as the amplitude of the AC voltage signal to which it is applied. The emitter resistors R10a and R10b of the transistors T3a and T3b provide the possibility of adjusting the amplitude of the AC current provided by these transistors as a function of the values chosen for these resistors.

In this amplifier it is easy that the amplitude of the AC current provided by the transistors T3a and T3b is substantially equal to that of the current provided by the transistors T2a and T2b without a particular limitation as far as the gain of the amplifier is concerned.

A degree of extra freedom concerning the independence of controlling the DC bias conditions with respect to the AC operating conditions (gain and linearity) is provided by the presence of an emitter resistor R10c connecting the emitters of the transistors T3a and T3b. This resistor has no effect on the DC bias of the transistors T3a and T3b, while its value, in parallel with the resistors R10a and R10b, acts on the current amplification of these transistors.

This similarly applies to the transistors T1a and T1b and their emitter resistor R11 with which the gain and the distortion of the amplifier can be precisely adjusted while taking the performances of the second stage formed by the transistors T2a, T2b, T3a, T3b, T4a and T4b into account.

The amplifier described in FIG. 2 is capable of supplying signals of a high amplitude at the output, in contrast to the known amplifier shown in FIG. 1.

On the other hand, the amplifier according to the invention may be controlled with a sufficient precision so that a negative feedback is possible through a direct connection of a resistor between the input and the output without any difficulty of stabilizing the circuit as a function of the temperature. This control may be realized by an appropriate choice of the values of the resistors as well as of power supply currents supplied by the current sources Sa and Sb. As is shown in FIG. 2, the output terminal 12 in the first module 100 is connected to the input terminal 11 via a negative feedback resistor R100, and similarly, the output terminal 22 in the second module 200 is connected to the input terminal 21 via a negative feedback resistor R200.

When such a negative feedback, which remains optional, is applied, it is advantageous to provide a resistor in parallel between the base of each transistor T1a and T1b and the reference voltage V2 as indicated by the references R110 and R210 in the Figure. The base-collector voltage of the transistors T1a and T1b can be increased by means of these resistors by the voltage drop produced in the resistors R100 and R200. These transistors T1a and T1b can thus produce signals whose voltage variation at their collector is relatively high so that a differential output signal of 2.5 volts peak having a good linearity can be obtained at a power supply voltage of 5 volts.

Those skilled in the art will be able to realize modifications of the amplifier described by way of example, notably as far as the aspect of DC operation and its stability with respect to temperature variations and power supply variations (V2-V1) is concerned.

Such modifications are nevertheless within the scope of the invention as claimed in the appendant claims.

I claim:

1. An amplifier comprising a first output transistor and a second output transistor having the same polarity and arranged in push-pull configuration, and an input transistor having a collector coupled to a base of the first output transistor, characterized in that the amplifier also comprises a third output transistor and a fourth output transistor which are also arranged in push-pull configuration, and a supplementary input transistor having an emitter coupled to an emitter of said input transistor, and a collector coupled to a base of the second output transistor and to a base of the third output transistor, a base of the fourth output transistor being coupled to the collector of said input transistor.

2. An amplifier as claimed in claim 1, characterized in that a coupling between the collector of said input transistor and the base of the fourth output transistor is ensured by a first further transistor which is supplementary to the first output transistor, said first further transistor having a base connected to the base of the first output transistor, and an emitter for supplying a voltage signal, a fraction of said voltage signal being applied to the base of the fourth output transistor, and, symmetrically, a coupling between the collector of the supplementary input transistor and the base of the second output transistor is ensured by a second further transistor which is supplementary to the third output transistor, said second further transistor having a base connected to the base of the third output transistor, and an emitter for supplying a further voltage signal, a fraction of said further voltage signal being applied to the base of the second output transistor.

3. An amplifier as claimed in claim 2, characterized in that said input transistor and the supplementary input transistor are arranged as a differential pair.

4. An amplifier as claimed in claim 2, characterized in that the fraction of the further voltage signal applied to the base of the second output transistor is derived from a first divider bridge, which includes a first series-arranged diode, connected to the emitter of said second further transistor, and the fraction of the voltage signal applied to the fourth output transistor is derived from a second divider bridge, which includes a second series-arranged diode, connected to the emitter of said first further transistor.

5. An amplifier as claimed in claim 3, characterized in that the emitter of said input transistor and the emitter of the supplementary input transistor are each fed by a current source and are mutually coupled by means of a first emitter resistor.

6. An amplifier as claimed in claim 5, characterized in that an emitter of the second output transistor and an emitter of the fourth output transistor are mutually coupled by means of a second emitter resistor.

7. An amplifier as claimed in claim 1, characterized in that a negative feedback resistor is directly connected between a connection of the first output transistor to the second output transistor, and a base of said input transistor, and a further negative feedback resistor is directly connected between a connection of the third output transistor to the fourth output transistor, and a base of the supplementary output transistor.

8. An amplifier as claimed in claim 7, characterized in that respective base resistors are connected between a common mode voltage (V2) and the base of said input transistor and the base of the supplementary input transistor, respectively.

* * * * *